(12) United States Patent
Lin

(10) Patent No.: US 7,944,708 B2
(45) Date of Patent: May 17, 2011

(54) STRUCTURED LIGHT-EMITTING MODULE FOR LIGHTING APPARATUS

(75) Inventor: Chi-Hsin Lin, Taipei County (TW)

(73) Assignee: Chi-Hsin Lin, Taipei County (TW)

( * ) Notice: Subject to any disclaimer, the term of this patent is extended or adjusted under 35 U.S.C. 154(b) by 413 days.

(21) Appl. No.: 12/078,272

(22) Filed: Mar. 28, 2008

(65) Prior Publication Data

US 2009/0244871 A1    Oct. 1, 2009

(51) Int. Cl.
*H01R 12/16* (2006.01)

(52) U.S. Cl. ..................... 361/785; 361/769

(58) Field of Classification Search .............. 361/785, 361/791, 760
See application file for complete search history.

(56) References Cited

U.S. PATENT DOCUMENTS

| 4,867,690 | A  | * | 9/1989  | Thumma ........................ 439/79 |
| 4,900,278 | A  | * | 2/1990  | Yamada et al. ............... 439/857 |
| 6,749,470 | B2 | * | 6/2004  | Dangelmaier ................ 439/857 |
| 6,851,831 | B2 | * | 2/2005  | Karlicek, Jr. ............. 362/249.06 |
| 7,148,428 | B2 | * | 12/2006 | Meier et al. ................... 174/260 |
| 2002/0025708 | A1 | * | 2/2002 | Wakui et al. ................. 439/188 |
| 2008/0220665 | A1 | * | 9/2008 | Darr et al. ..................... 439/842 |

* cited by examiner

*Primary Examiner* — Yuriy Semenenko

(74) *Attorney, Agent, or Firm* — Birch, Stewart, Kolasch & Birch, LLP

(57) ABSTRACT

A light-emitting module for a lighting apparatus comprises at least two substrates, each provided with a printed circuit having an LED, and plural matching terminal blocks and buckles so that the substrates can be structured into a planar light-emitting module having a relatively large area by assembly of the terminal blocks and the buckles. The light-emitting module is adaptive to be used in a billboard, a traffic sign, a three-dimensional lighting apparatus or a lighting display screen.

6 Claims, 7 Drawing Sheets

STRUCTURED LIGHT-EMITTING MODULE FOR LIGHTING APPARATUS

BACKGROUND OF THE INVENTION

1. Technical Field

The present invention relates to a structured light-emitting module, wherein substrates each having a relatively small size and being provided with a light source are assembled to form a planar board or a three-dimensional article having a relatively large size that is particularly adaptive to be used in a billboard, a traffic sign or a landscape light.

2. Description of Related Art

In occasions where intensive illumination is required, such as occasions of billboards, guiding lights, lighting display screens or other lighting apparatuses, high-intensity lighting bulbs, such as halogen bulbs, are conventionally employed. In other occasions where color decoration is further required additional to intensive illumination, neon lamps are traditionally chosen to provide decoration, illumination, and adornment. However, such highly intensive and bright lighting apparatuses are quite power consuming. With the gradually risen advocacy of energy conservation and the rapid progress of light-emitting diode (hereinafter referred to as the LED) technology, many billboards, guiding lights (traffic lights), lighting display screens and other lighting apparatuses are tending to be composed of LED arrays.

However, in an existing LED billboard, as shown in FIG. 7, a light-emitting module is formed upon an integral circuit board 60, whereon plural sockets are formed in a close order to receive LEDs 70, respectively. The LEDs 70 may be arrayed into designed patterns or numerals and switched to change among different lighting appearances by an electronic chip. Consequently, the light-emitting module can be extensively applied to illumination for billboards, traffic lights, guiding lights, and lighting display screens.

Referring to FIG. 8, the circuit board 61 may be trimmed into a substantially irregular shape matching a contour of an LED array 71 in order to downsize the circuit board 61 and reduce material costs thereof. Nevertheless, in such case, the manufacturing costs can otherwise increase due to complex process for trimming the circuit board 61.

To sum up, the conventional LED lighting module has the following shortcomings.

1. As the relatively large circuit board has to have the LEDs welded thereon in a factory before transported to a site where it is to be installed, circuit of the LED array typically tends to get damaged by being jolted during transportation. Besides, while the relatively large circuit board is apt to deform by wind on the installation site, the gravitation, and deflection of its material, installation thereof is uncontrollable. Consequently, though the LEDs are superior to the traditional halogen bulbs and neon lamps in the respects of material costs and power consumption, installation thereof is desirably difficult and expansive.
2. The conventional LED display screen, confined by its integral large circuit board, can be only applied to a single plane (e.g. a wall), but not be designed as crossing two planes (e.g. two adjacent walls), an inclined plane tilting for a predetermined angle, nor a three-dimensional structure, and thus needs to be improved.

Thus, the inventor of the present invention, with the attempt to overcome the foregoing defects, proposes a novel structured light-emitting module, which can be easily formed into an adjustable appearance on an installation site.

SUMMARY OF THE INVENTION

A primary objective of the present invention is to provide a structured light-emitting module, wherein substrates each having a relatively small size and a light source are mutually combined through terminal blocks and buckles to structure a relatively large planar board, or a multi-plane structure having adjacent planes that include angles, or a three-dimensional article. The structured light-emitting module is easy to be installed and provides excellent efficiency in power saving and resplendence, leading to its outstanding adaptability to applications of billboards, traffic signs or landscape lights.

To achieve the above objective, the structured light-emitting module of the present invention comprises:

at least two substrates, each provided with a printed circuit and components and having more than one light source, wherein the substrate comprises a plurality of assembly holes at sides thereof; a terminal block, having a plurality of terminals and fixedly assembled to the assembly holes on the substrates; and a buckle, sized corresponding to the terminal block and having a plurality of assembly holes female terminals, wherein the buckle is to be combined with the terminal block so as to serially or parallely connect the two substrates. In such manner, more said substrates can be structured into a planar structure shaped in a pattern or designed characters as to be used as a billboard, a traffic sign or a lighting display screen.

Besides, when the terminal block is formed into a bent shape, the substrates can be combined with an included angle therebetween so as to form as a three-dimensional structure having multiple adjacent planes for functioning as a lighting apparatus or an billboard with enhanced variableness.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

Figure 1:
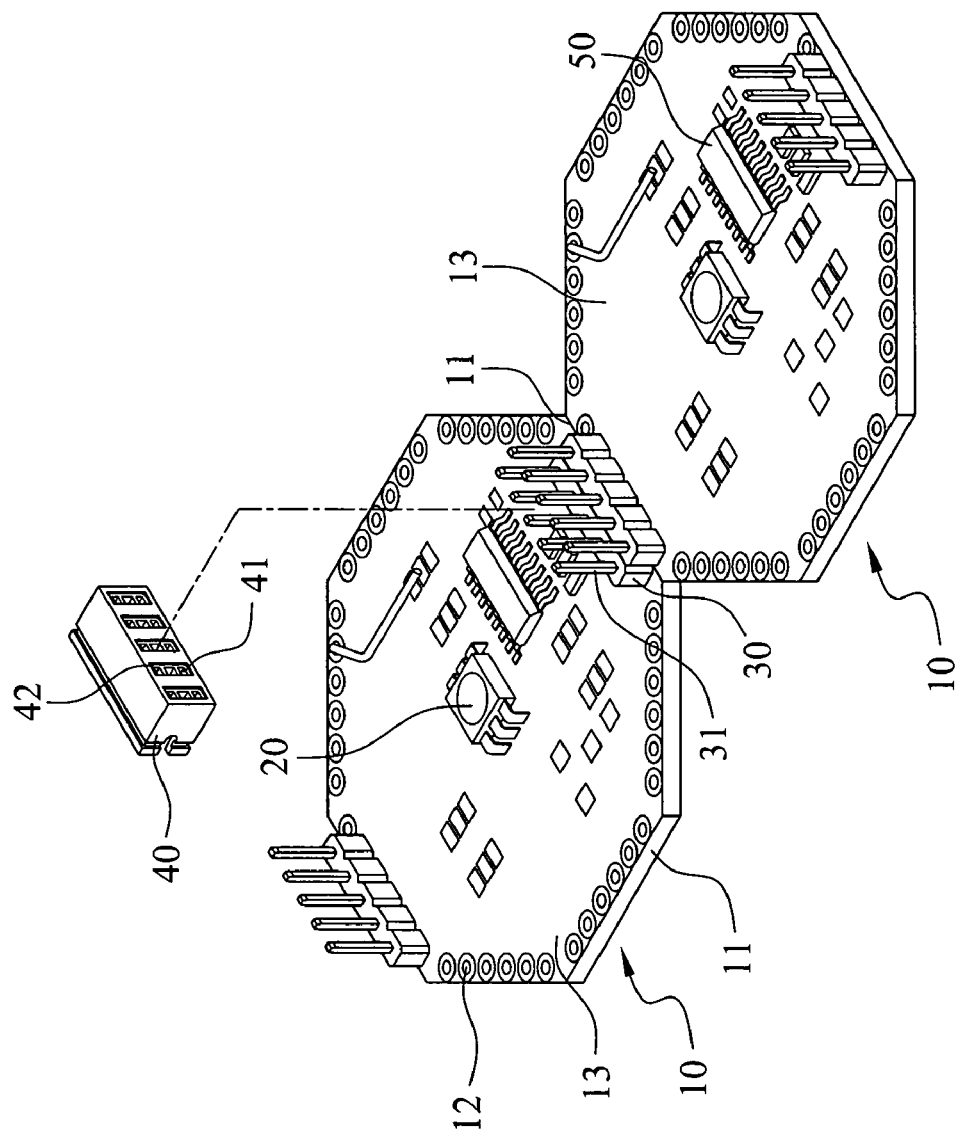
FIG. 1 is a perspective view of the disclosed subject matter according to one embodiment of the present invention.

Please refer to FIG. 1 for the disclosure of the present invention. Therein, a structured light-emitting module comprises at least two substrates 10. Each said substrate 10 is provided with a printed circuit and components 50 on a surface 13 thereof, and has at least one light source 20. The light source 20 is preferably embodied with LEDs (Light-Emitting Diodes). The light source 20 may be one single bright LED or a plurality of LEDs arrayed on and covering a certain region of the substrate 10. Besides, the substrate 10 may be of a random shape or a regular (or irregular) polygon. In the case that the substrate 10 is a regular polygon, it is a regular polygon having at least three sides 11, such as a triangle, a quadrilateral, a pentagon, or a hexagon. Alternatively, the substrate 10 may be of an octagon having eight sides 11 as shown in FIG. 1. Furthermore, more than one assembly hole 12 is provided at each of at some certain or all sides 11 of the substrate 10.

The structured light-emitting module also has a terminal block 30 comprising a plurality of terminals 31 fixedly assembled into the assembly holes 12 of the substrates 10.

The structured light-emitting module further comprises a buckle 40 that is sized corresponding to the terminal block 30 and provided with a plurality of sockets 41 and female terminals 42. The buckle 40 is for assembled to the terminal block 30 so as to serially or parallely connect two said substrates 10.

Figure 2:
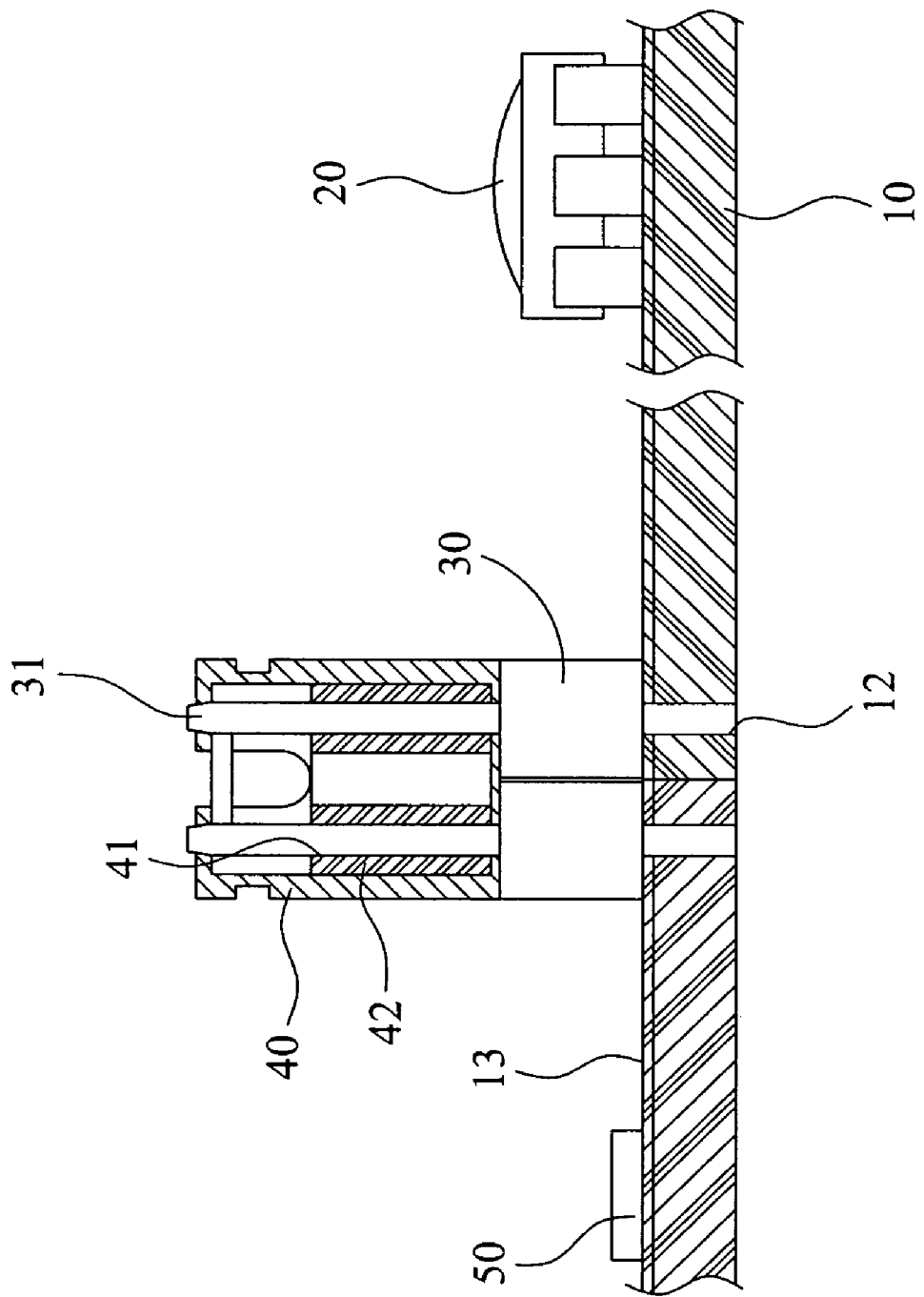
FIG. 2 is a sectional view of two assembled substrates according to the present invention.
Figure 3:
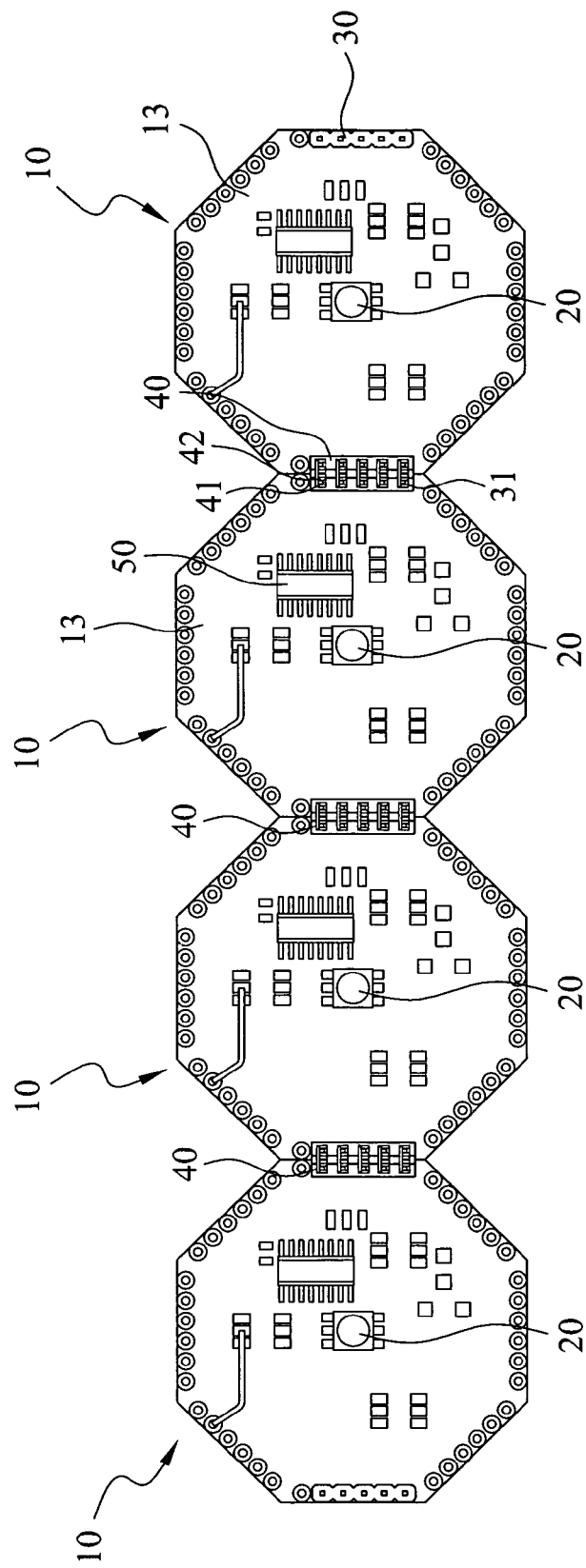
FIG. 3 is an applied view of the disclosed subject matter wherein the substrates are connected in series in a planar application.

Please see FIGS. 2 and 3. In FIG. 2, two said substrates 10 are combined together by assembling the buckle 40 with the terminal block 30 and thereby a planar board of FIG. 3 can be structured for functioning as a light-emitting module used in a billboard, a traffic sign or a lighting display screen.

Figure 4:
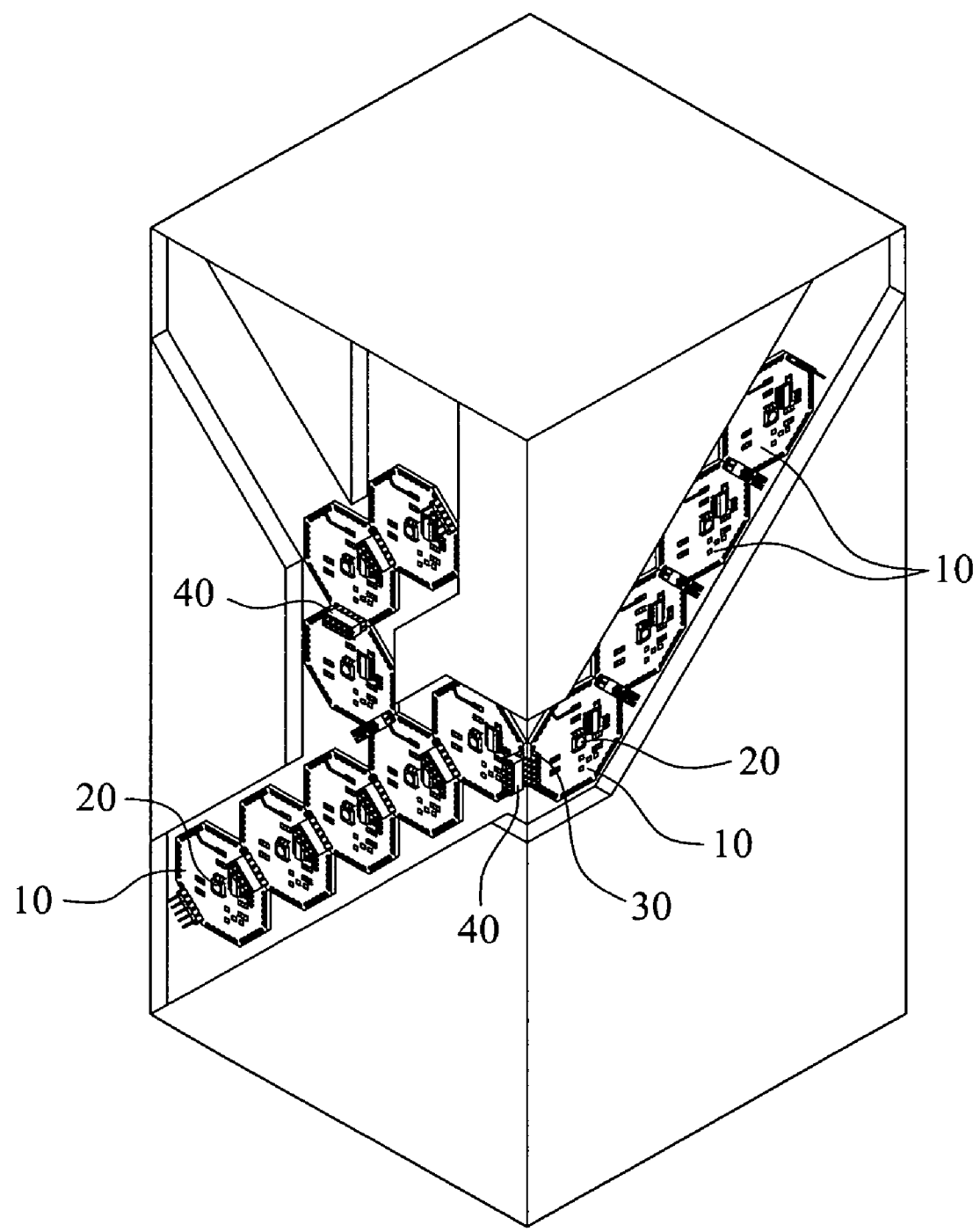
FIG. 4 is another applied view of the disclosed subject matter.
Figure 5:
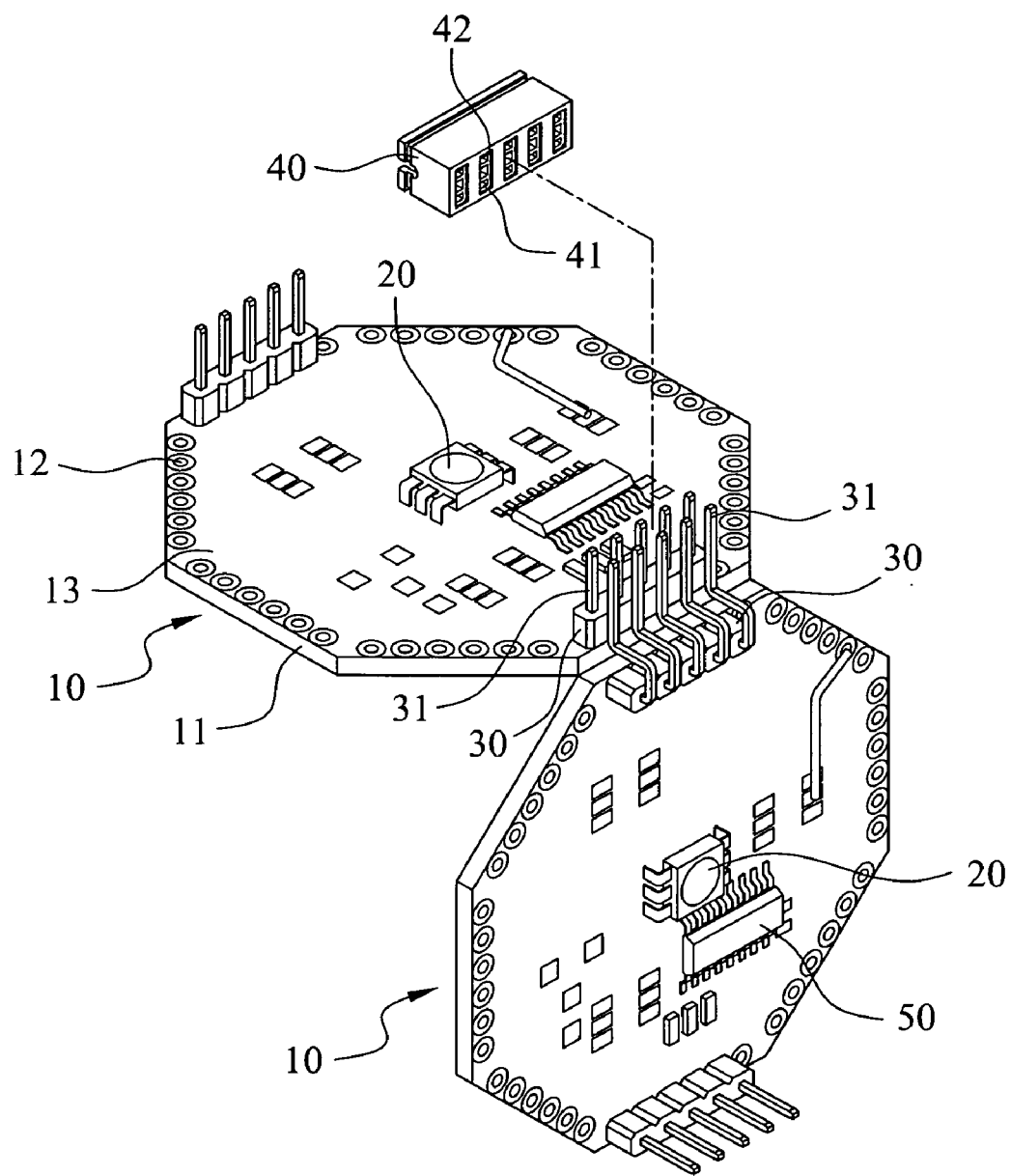
FIG. 5 is another applied view of the disclosed subject matter wherein the substrates are connected with an angle included therebetween.

The present invention, in practice, is also adaptive to applications of three-dimensional structures. Referring to FIG. 4, a lighting pillar may have its inner surface, or more particularly, its two inner planes, equipped with the disclosed subject matter. With reference to FIGS. 4 and 5, for allowing two substrates 10 to be combined into a shape matching that of two adjacent walls that include an angle thererbetween, the terminal block 30 can be formed as a bent shape (e.g. an L-shaped form) and the terminals 31 can be accordingly arranged and form a plug in one direction so that the buckle 40 can be assembled thereto. Alternatively, the present invention may be realized by two said terminal blocks 30 and one bent buckle 40 though such embodiment is not shown by figures. It shall be understood that numerous variations according to the known skill about connectors are also applicable without going outside the scope of the present invention.

Figure 6:
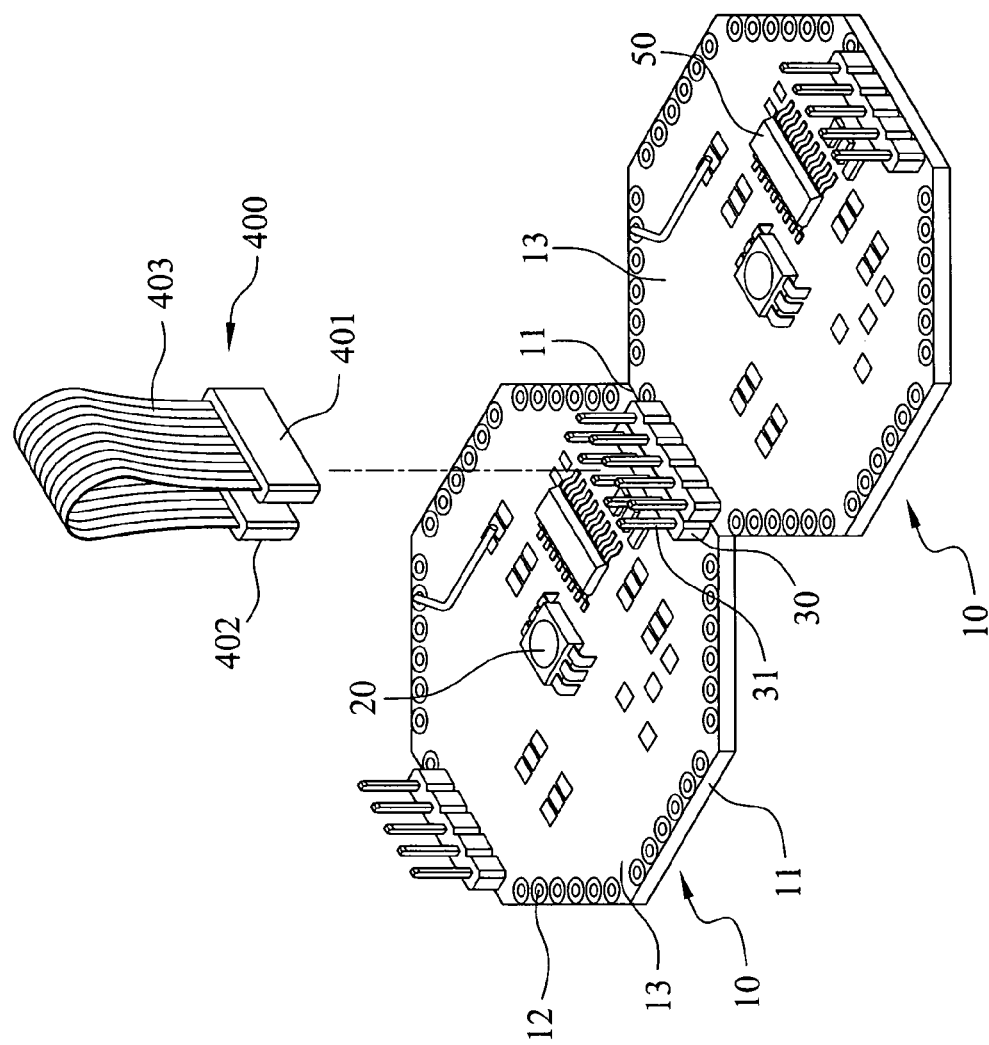
FIG. 6 is another applied view of the disclosed subject matter wherein the substrates are connected according to another embodiment of the present invention.
Figure 7:
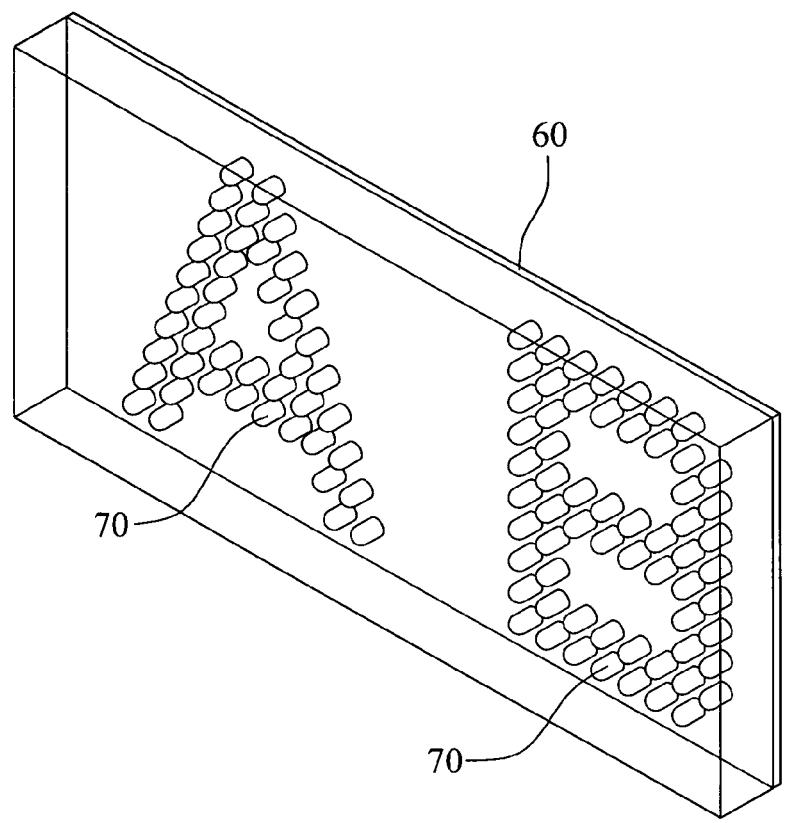
FIG. 7 is a schematic drawing showing a conventional light-emitting module.
Figure 8:
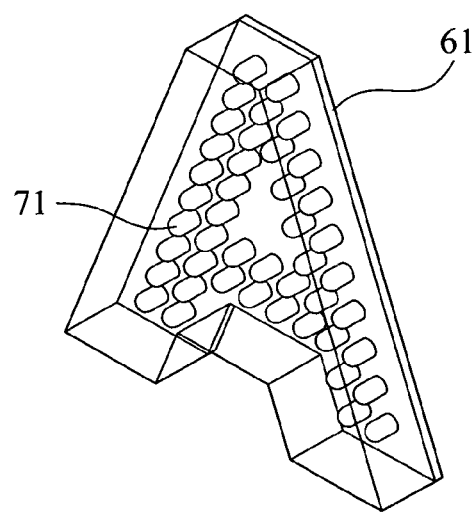
FIG. 8 is a schematic drawing showing another conventional light-emitting module.

Now referring to FIG. 6 for a buckle 400 according to an alternative embodiment of the present invention. The buckle 400 is substantially a flat cable 403 having two connectors 401, 402 formed at two opposite ends thereof. When the two connectors 401, 402 are assembled to two said terminal blocks 30, a flexible yet excellent connection between the terminal blocks 30 is achieved.

Hence, since the light-emitting module of the present invention can be assembled to structure a lighting apparatus presenting any pattern or special design for a planar or three-dimensional billboard, the concept of the present invention is unprecedented in the art and has advantage of that:

1. While the present invention implements the relatively small substrates combined by the terminal blocks and the buckles to form a relatively large planar billboard or lighting display screen, the components are easy to manufacture, convenient and safe to assemble plus handy and time-saving to dispatch, thereby providing great convenience; and 2. Since the light-emitting module of the present invention is structured from the relative small substrates, it can be structured as a lighting apparatus crossing two planes (e.g. two adjacent walls), of an inclined plane tilting for a predetermined angle, or even of a three-dimensional shape, thereby providing excellent variety.

Although the particular embodiments of the invention have been described in detail for purposes of illustration, it will be understood by one of ordinary skill in the art that numerous variations will be possible to the disclosed embodiments without going outside the scope of the invention as disclosed in the claims.

The present invention provides the advantages of convenient and safe manufacture, construction and transportation, plus easy assembly and economy as previously described. Thus, practicability of the present invention is genuine and the disclosed subject matter is unprecedented in the art. It is believed that the presently disclosed subject matter satisfies the requirement for a Patent Application, thus such application is herein filed. An early Notice of Allowance on the Application will be appreciated.

What is claimed is:

1. A structured light-emitting module for a lighting apparatus, at least comprising:
    two substrates, each provided with a printed circuit and components and having more than one light source, wherein the substrate comprises at least three sides and more than one assembly hole is provide at a predetermined position on each said side;
    a terminal block, having a plurality of terminals and fixedly assembled to the assembly holes on the substrates; and
    a buckle, sized corresponding to the terminal block and provided with a plurality of sockets and female terminals, whereby when the buckle is assembled to the terminal blocks, the two substrates are serially or parallely connected,
    wherein, the terminal block is formed into a bent shape; and
    wherein, the buckle comprises a flat cable having two connectors at two opposite end thereof.

2. The light-emitting module of claim 1, wherein, the light source is at least one LED (Light-emitting Diode).

3. The light-emitting module of claim 1, wherein, the light source comprises a plurality of LEDs (Light-emitting Diodes) covering a certain region of the substrate.

4. The light-emitting module of claim 1, wherein, the light source is a single bright LED (Light-emitting Diode).

5. The light-emitting module of claim 1, wherein, the substrate is of an irregular polygon.

6. A structured light-emitting module for a lighting apparatus, at least comprising:
    two substrates, each provided with a printed circuit and components and having more than one light source, wherein the substrate is a board of a random shape and more than one assembly hole is provide at a predetermined position on each said side;
    a terminal block, having a plurality of terminals and fixedly assembled to the assembly holes on the substrates; and
    a buckle, sized corresponding to the terminal block and provided with a plurality of sockets and female terminals, whereby when the buckle is assembled to the terminal blocks, the two substrates are serially or parallely connected,
    wherein, the terminal block is formed into a bent shape; and
    wherein, the buckle comprises a flat cable having two connectors at two opposite end thereof.

* * * * *